US008188482B2

(12) United States Patent
Treu et al.

(10) Patent No.: US 8,188,482 B2
(45) Date of Patent: May 29, 2012

(54) SIC SEMICONDUCTOR DEVICE WITH SELF-ALIGNED CONTACTS, INTEGRATED CIRCUIT AND MANUFACTURING METHOD

(75) Inventors: Michael Treu, Villach (AT); Kathrin Rueschenschmidt, Villach (AT); Oliver Haeberlen, Villach (AT); Franz Auerbach, Villach (AT)

(73) Assignee: Infineon Technologies Austria AG, Villach (AT)

(*) Notice: Subject to any disclaimer, the term of this patent is extended or adjusted under 35 U.S.C. 154(b) by 475 days.

(21) Appl. No.: 12/341,370

(22) Filed: Dec. 22, 2008

(65) Prior Publication Data
US 2010/0155743 A1  Jun. 24, 2010

(51) Int. Cl.
*H01L 29/12* (2006.01)
(52) U.S. Cl. ............... 257/77; 257/250; 257/256
(58) Field of Classification Search ......... 257/77, 257/134, 256–287, E29.069, E29.174, E29.188, 257/341, 342; 438/186
See application file for complete search history.

(56) References Cited

U.S. PATENT DOCUMENTS

| 5,510,632 | A | * | 4/1996 | Brown et al. ............... 257/77 |
| 5,618,688 | A | * | 4/1997 | Reuss et al. ............... 438/189 |
| 5,726,463 | A |   | 3/1998 | Brown et al. |
| 5,861,643 | A | * | 1/1999 | Chen et al. ............... 257/256 |
| 6,034,385 | A |   | 3/2000 | Stephani et al. |
| 6,329,675 | B2 |  | 12/2001 | Singh et al. |
| 7,560,755 | B2 | * | 7/2009 | Kapoor ............... 257/256 |
| 2006/0060892 | A1 | * | 3/2006 | Hackler et al. ............... 257/250 |
| 2008/0079068 | A1 | * | 4/2008 | Kim ............... 257/330 |
| 2008/0128762 | A1 | * | 6/2008 | Vora ............... 257/288 |
| 2008/0272402 | A1 | * | 11/2008 | Saha et al. ............... 257/256 |
| 2010/0032731 | A1 | * | 2/2010 | Babcock et al. ............... 257/280 |

FOREIGN PATENT DOCUMENTS

| DE | 19548443 A1 | 6/1997 |
| DE | 10350160 A1 | 6/2005 |
| EP | 0704894 B1 | 12/2002 |
| WO | 97/23911 A1 | 7/1997 |

* cited by examiner

*Primary Examiner* — Wai Sing Louie
*Assistant Examiner* — Sue Tang
(74) *Attorney, Agent, or Firm* — Dicke, Billig & Czaja, PLLC

(57) ABSTRACT

One aspect includes a semiconductor device with self-aligned contacts, integrated circuit and manufacturing method. One embodiment provides gate control structures. Each of the gate control structures is configured to control the conductivity of a channel region within a silicon carbide substrate by field effect. A contact hole is self-aligned to opposing sidewalls of adjacent gate control structures by intermediate spacers.

14 Claims, 15 Drawing Sheets

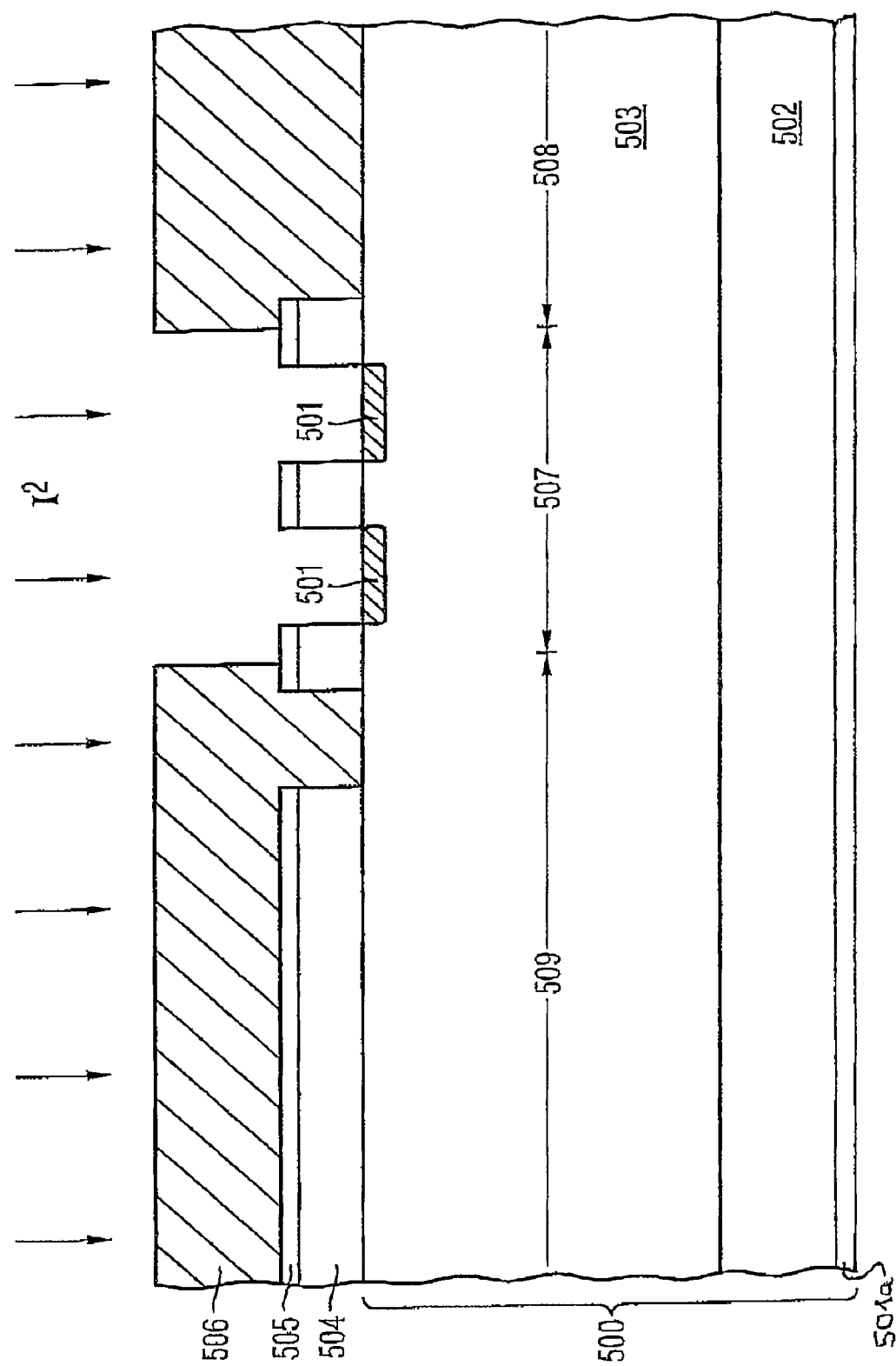

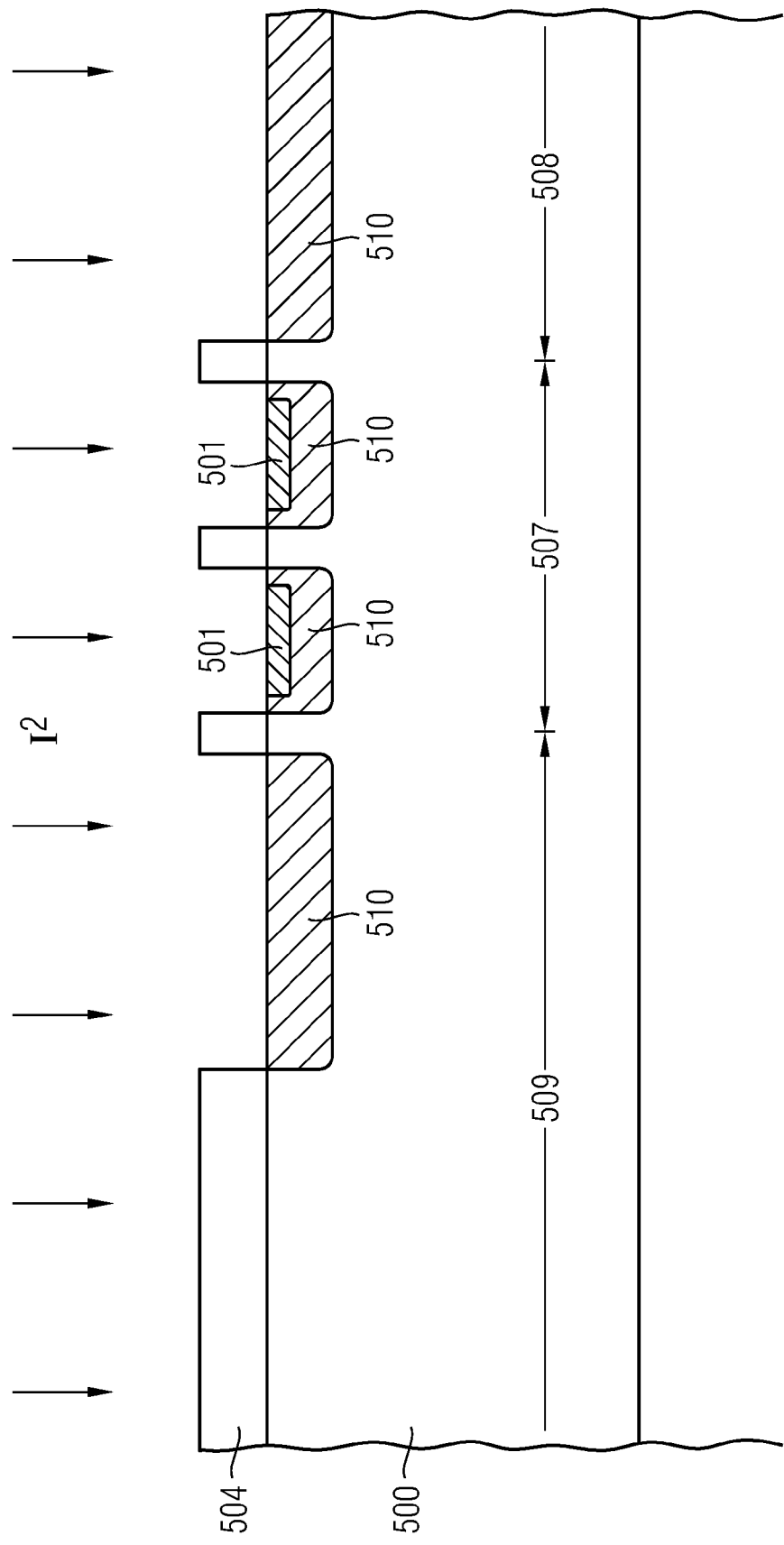

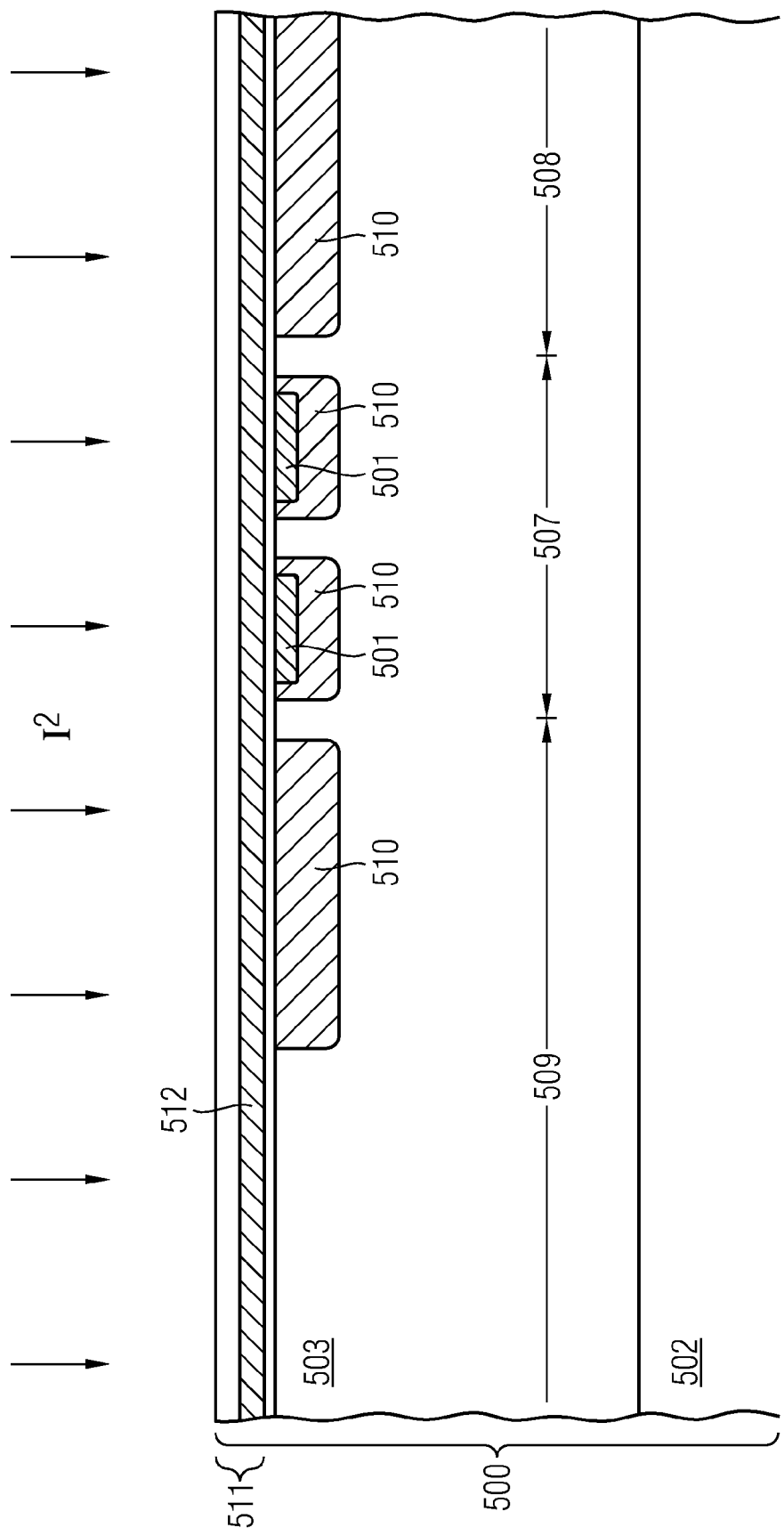

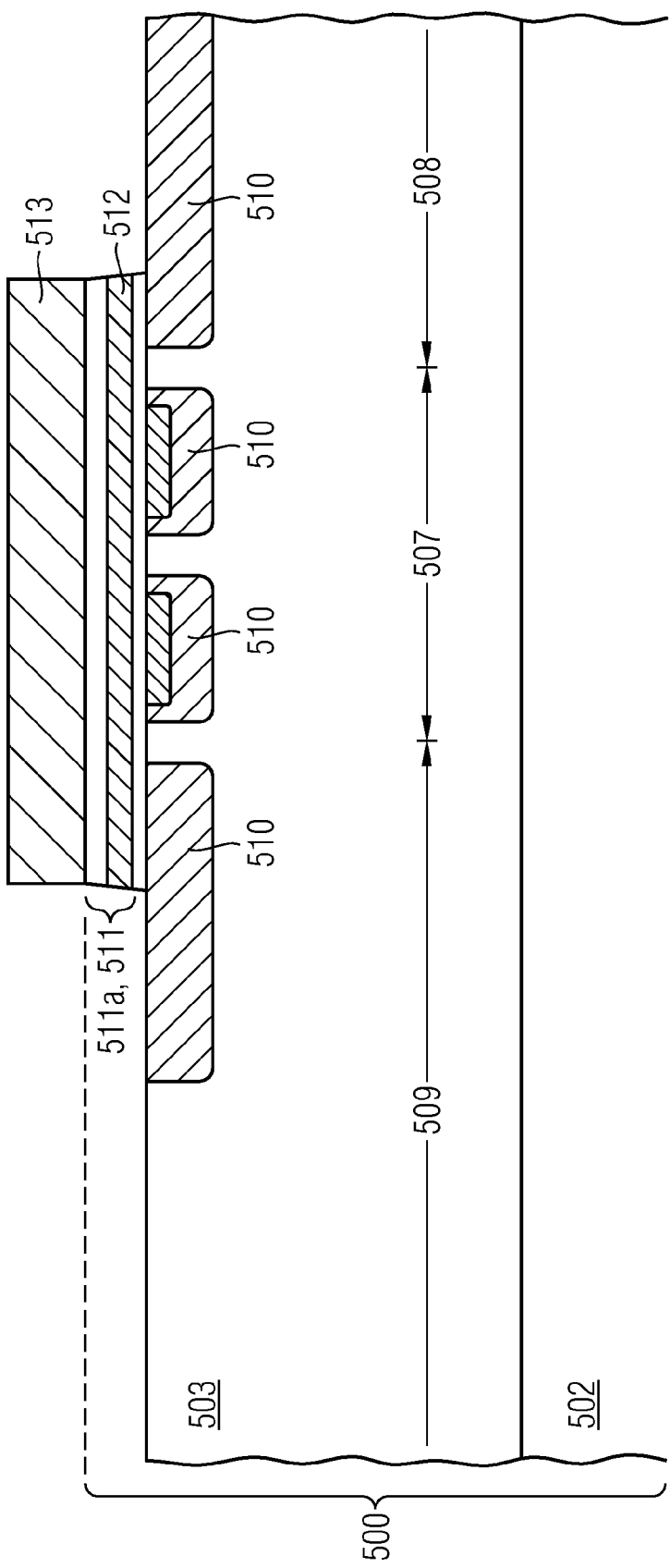

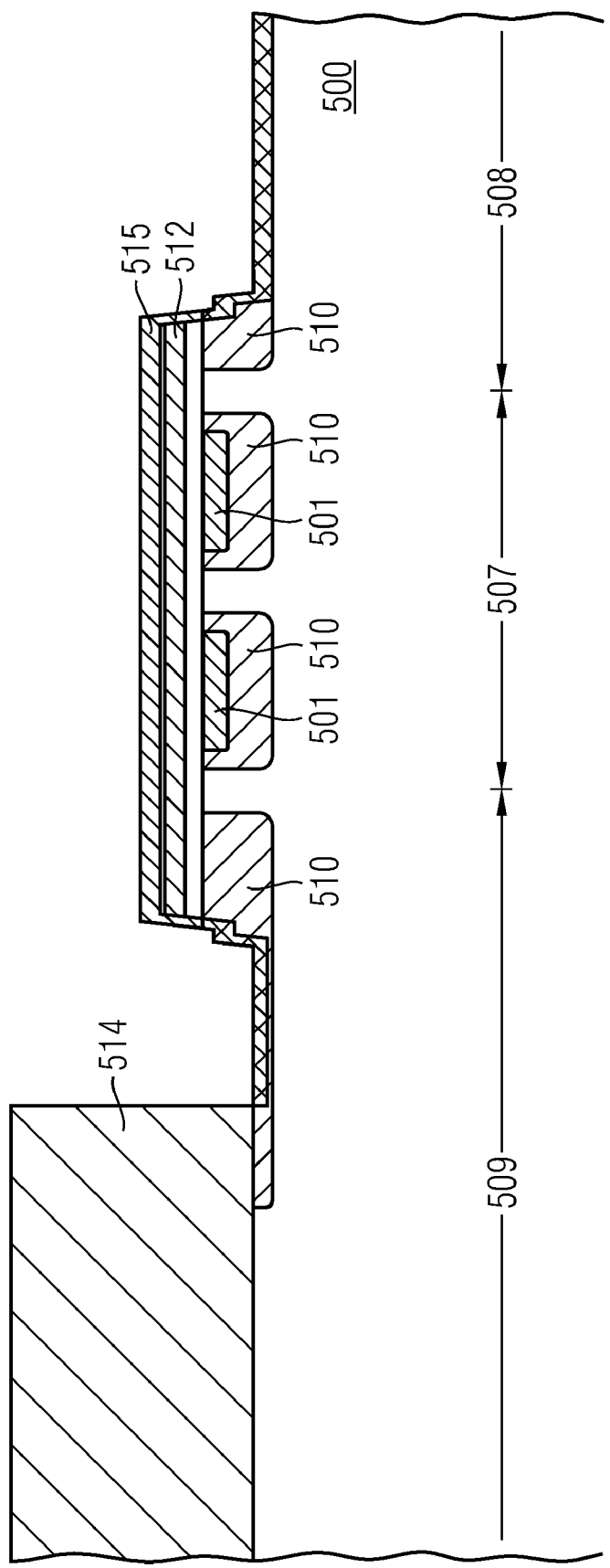

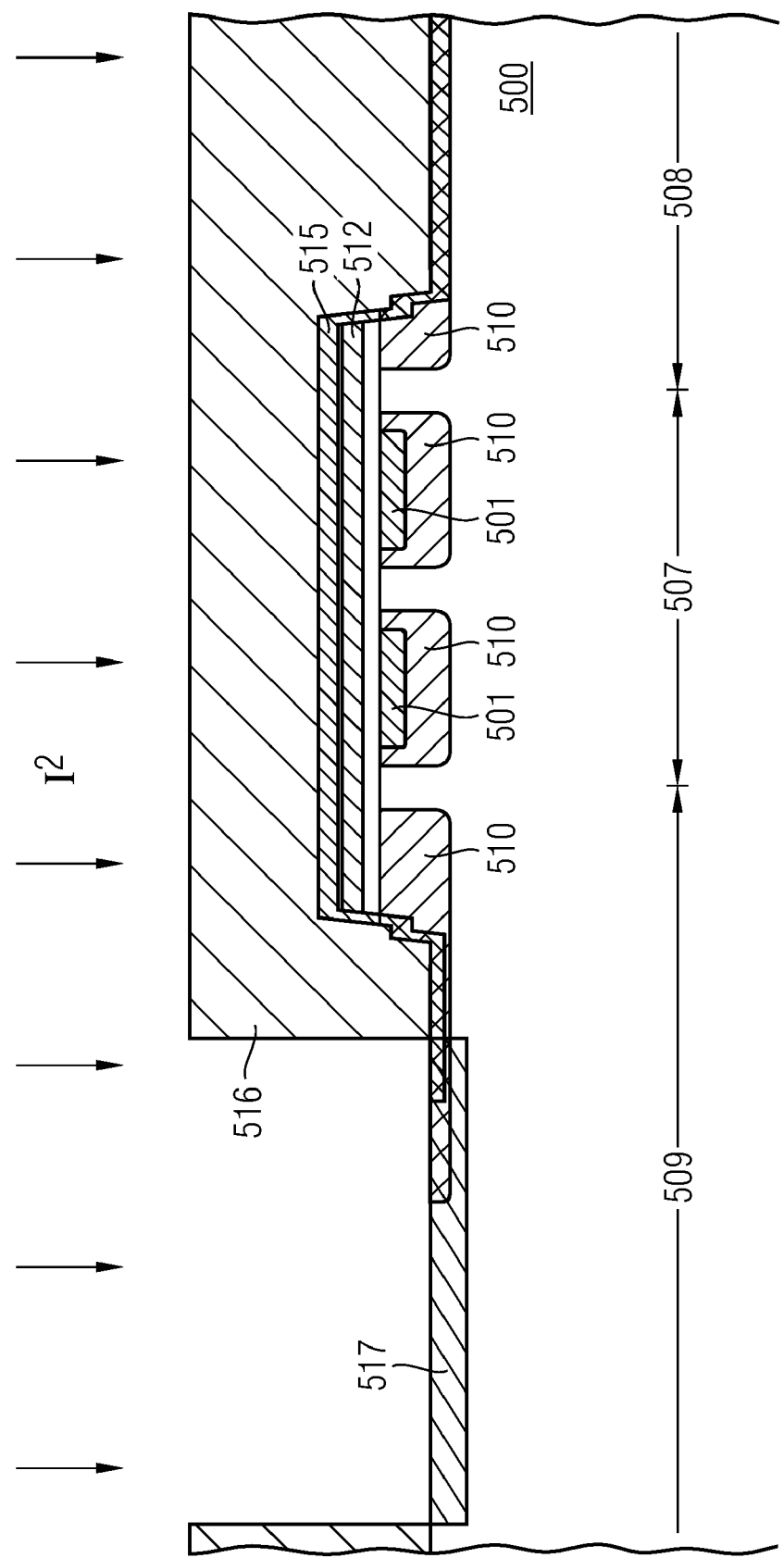

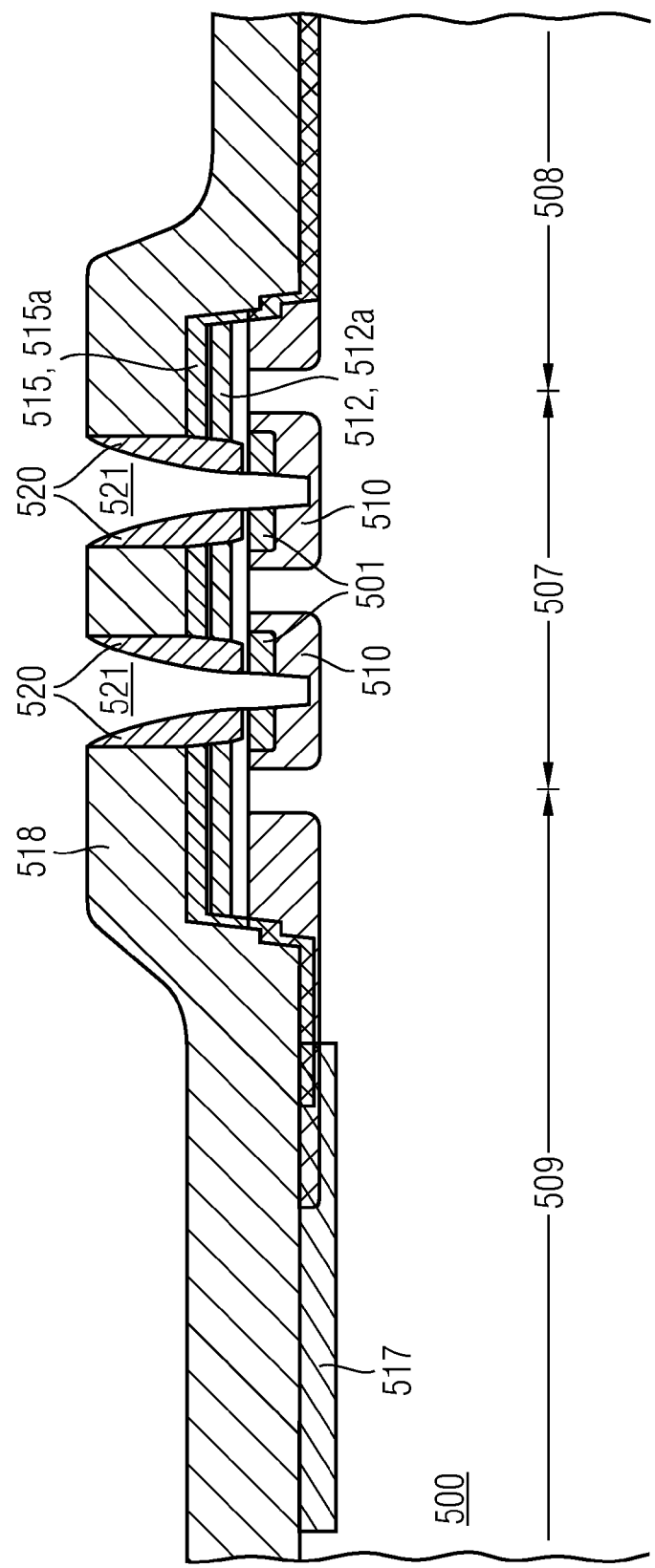

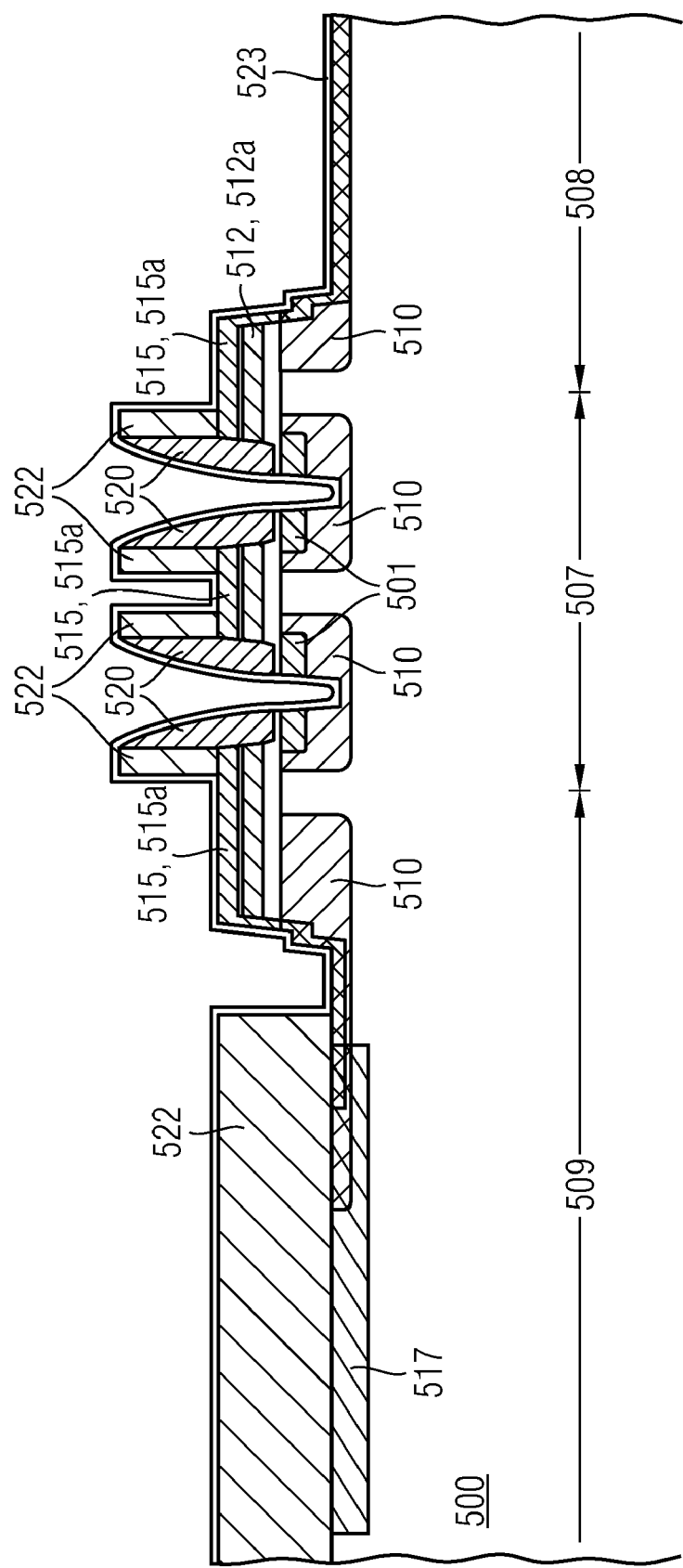

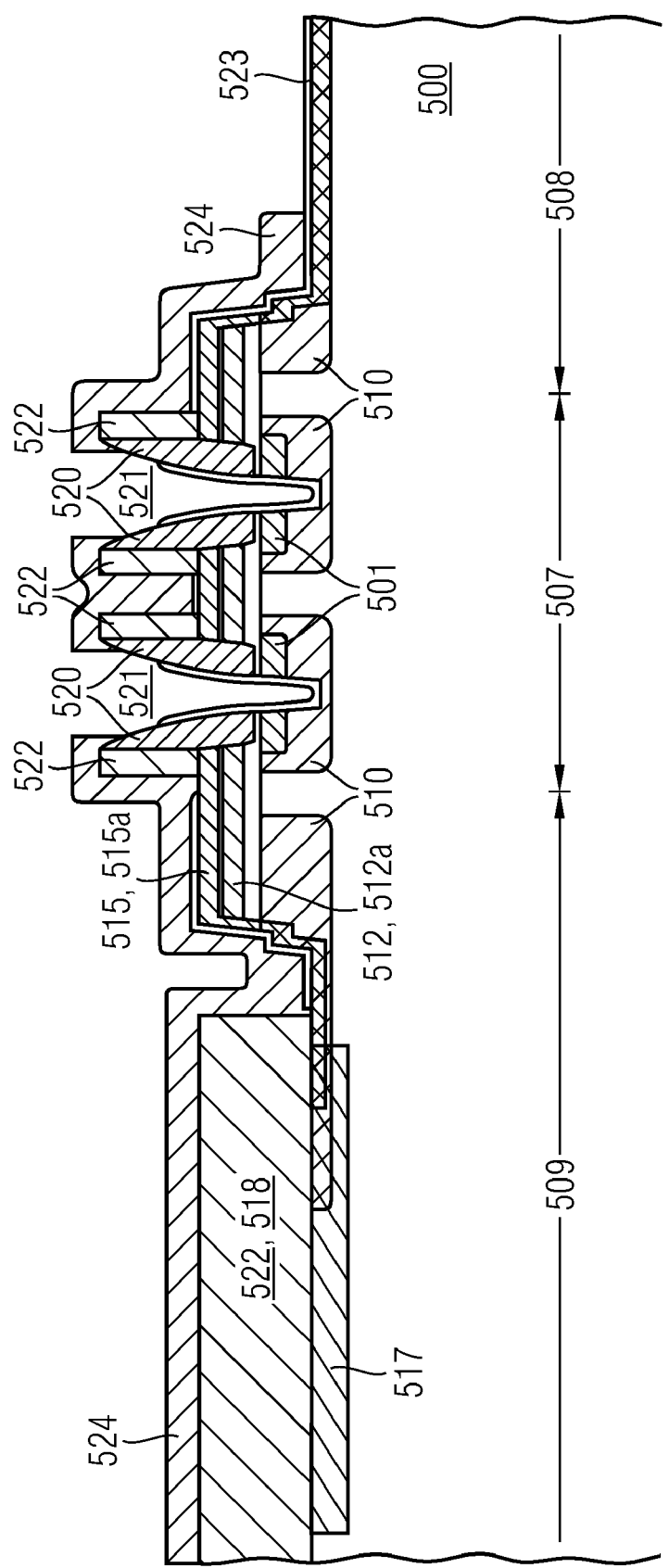

SIC SEMICONDUCTOR DEVICE WITH SELF-ALIGNED CONTACTS, INTEGRATED CIRCUIT AND MANUFACTURING METHOD

BACKGROUND

Due to a high thermal conductivity and a wide band gap, silicon carbide (SiC) is used as a substrate material for a variety of semiconductor applications such as high-power applications or high-voltage applications. As material properties of SiC are different from silicon (Si), process sequences realized in Si technology may not be identically transferred to SiC technology. For example, annealing of implant damages in SiC may require higher temperatures than in Si. In addition, with regard to SiC semiconductor devices and SiC integrated circuits, there is also a need for reduction of device dimensions.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 5A illustrates a schematic cross-sectional view of a SiC substrate portion for illustrating a method of manufacturing a JFET in accordance with one embodiment after forming source regions.

FIG. 5B illustrates a cross-sectional view of the SiC substrate portion of FIG. 5A after forming buried gate regions self-aligned to the source regions.

FIG. 5C illustrates a cross-sectional view of the SiC substrate portion of FIG. 5B after forming a channel layer.

FIG. 5D illustrates a cross-sectional view of the SiC substrate portion of FIG. 5C after patterning a third mask and the channel layer.

FIG. 5F illustrates a cross-sectional view of the SiC substrate portion of FIG. 5E after removing the third mask and forming a top gate layer on the SiC substrate.

FIG. 5G illustrates a cross-sectional view of the SiC substrate portion of FIG. 5E after forming a doped semiconductor region within the SiC substrate.

FIG. 5I illustrates a cross-sectional view of the SiC substrate portion of FIG. 5H after recessing part of the spacer layer until spacers remain to define contact holes that are self-aligned to the top gate regions.

FIG. 5J illustrates a cross-sectional view of the SiC substrate portion of FIG. 5I after removing part of the sixth mask and forming a contact layer on remnant portions of the sixth mask, spacers and exposed SiC substrate portions.

FIG. 5K illustrates a cross-sectional view of the SiC substrate portion of FIG. 5J after patterning the contact layer, forming an intermediate dielectric layer and patterning the intermediate dielectric layer.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

A semiconductor device as described herein includes gate control structures. Each of the gate control structures is configured to control the conductivity of a channel region within a silicon carbide substrate by field effect. A contact is self-aligned to opposing sidewalls of adjacent gate control structures by intermediate spacers.

According to one embodiment of a method of manufacturing a semiconductor device as described hereinafter, gate control structures are formed. Each of the gate control structures is configured to control the conductivity of a channel region within a silicon carbide substrate by field effect. A contact is formed self-aligned to opposing sidewalls of adjacent gate control structures by intermediate spacers.

Figure 1:
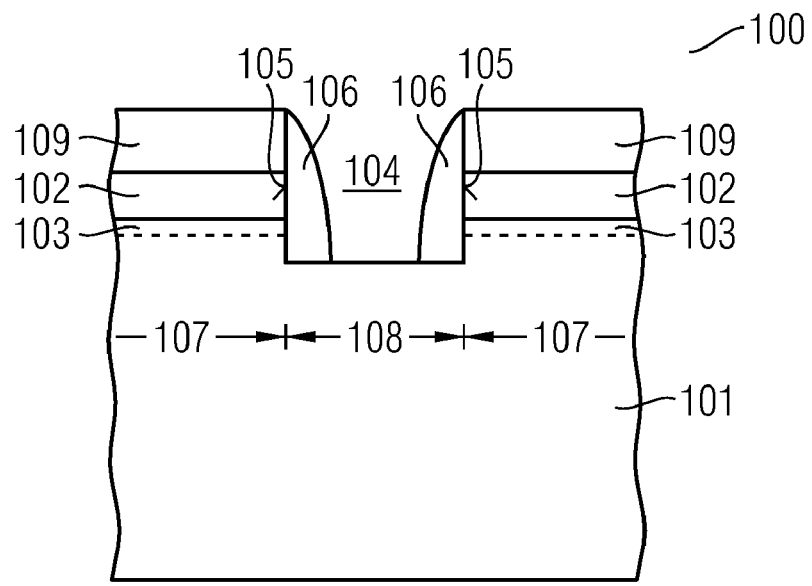
FIG. 1 illustrates a cross-sectional view of a semiconductor device portion including a SiC substrate having protruding and recessed substrate portions in accordance with one embodiment.

FIG. 1 illustrates a cross-sectional view of a semiconductor device 100 including a SiC substrate 101 and gate control structures 102 configured to control the conductivity of a channel region 103 in the SiC substrate 101 by field effect. The semiconductor device 100 furthermore includes a contact hole 104 being self-aligned to opposing sidewalls 105 of adjacent gate control structures 102 by intermediate spacers 106. By way of example, a distance between the contact hole 104 and the control structures 102 on a level with the channel region 103 may be 30 nm or less, or 50 nm or less, for example. If a first element is denoted as self-aligned to a second element in the context of this description, then a lateral distance between both elements is free of lithographic misalignment which may occur if both elements are formed using separate lithographic processes.

The SiC substrate 101 may be pre-processed and may include, for example, one or several epitaxial semiconductor layers such as epitaxial SiC layers on a SiC base. The SiC substrate 101 may also include protruding portions 107 and recessed portions 108.

The SiC substrate 101 may also include doped semiconductor regions formed therein (not illustrated in FIG. 1). By way of example, the semiconductor device 100 may be or may include a JFET having source/drain regions, and a bottom gate structure embedded in the SiC substrate 101. The channel region 103 may be formed within an epitaxial layer of a protruding substrate portion 107 of the SiC Substrate 101, by way of example. The source/drain regions may be embedded in the bottom gate structure.

The gate control structures 102 may be top gate electrodes of a JFET, for example.

An insulating layer 109 may be formed above the gate control structures 102. The insulating layer 109 may include one or a plurality of insulating portions that may differ from each other with regard to shape and material. By way of example, the insulating layer 109 may include a remnant portion of a hard mask used for patterning the gate control structures 102. In this case, the remnant portion of the hard mask is in direct contact with a first sidewall of the spacers 106, respectively. A further remnant portion of the hard mask may also be left in a peripheral area of the gate control structures 102, e.g., outside an active cell area of the semiconductor device 100.

By way of example, the spacers 106 and the insulating layer 109 may be formed of different insulating materials, respectively. By way of example, the spacers 106 and the insulating layer 109 may be formed of any of insulating oxides and insulating nitrides, for example, $Si_xO_y$ such as undoped or doped $SiO_2$, for example, BSG, BPSG, PSG, and $Si_xN_y$ such as $Si_3N_4$. The spacers 106 and the insulating layer 109 may also be formed of same insulating materials, e.g., $Si_xO_y$, such as $SiO_2$.

According to the illustrated embodiment, a bottom side of the contact hole 104 may be on a same level with the bottom side of the spacers 106. According to another embodiment, the contact hole 104 may extend into the SiC substrate 101. An extension of the contact hole 104 into the SiC substrate 101 may be effected by removing material of the SiC substrate 101, e.g., by an etch process and using the spacers 106 as an etch mask. When extending the contact hole 104 into the SiC substrate 101, semiconductor regions formed within the SiC substrate 101, e.g., bottom gates and source/drain regions, may not only be electrically connected via a bottom side of the contact hole 101 filled with one or a plurality of conductive materials, but also by part of a sidewall of the contact hole 104 adjoining to the SiC substrate 101. For example, the contact hole 104 may include one or a plurality of contact materials, e.g., a NiAl, TiAl, W, Ti, Al, C or Cu and combinations thereof.

In accordance with one embodiment, the semiconductor device 100 is a discrete semiconductor chip, e.g., a discrete power semiconductor device. In accordance with other embodiments, further semiconductor devices are formed in the SiC substrate 101 and the semiconductor device 100 is an integral part of an integrated circuit.

Figure 2:
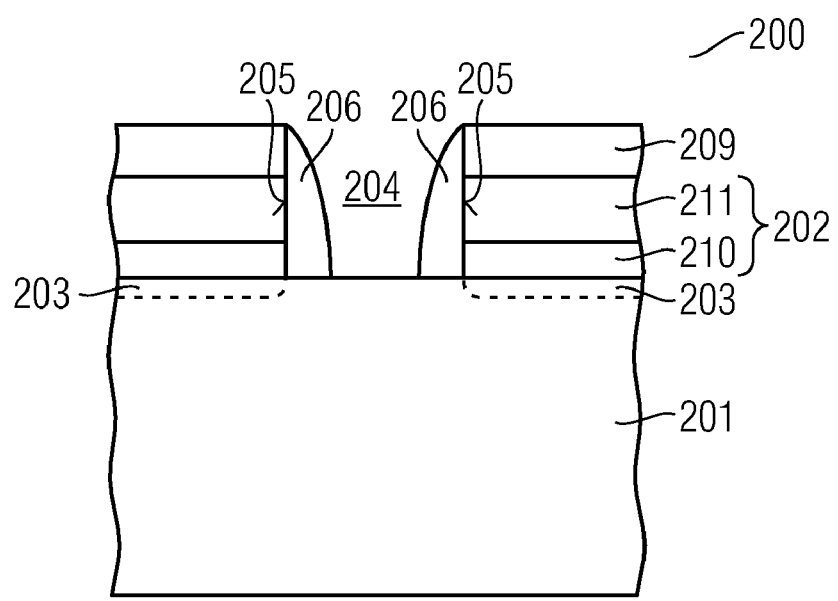
FIG. 2 illustrates a cross-sectional view of a semiconductor device portion including a SiC substrate in accordance with one embodiment referring to a flat substrate portion.

FIG. 2 schematically illustrates a portion of a semiconductor device 200 according to a further embodiment. The semiconductor device 200 includes gate control structures 202, wherein each of the gate control structures 202 may control the conductivity of a channel region 203 in the SiC substrate 201 by field effect and wherein each of the gate control structures 202 includes a gate electrode 211 and a gate dielectric 210 sandwiched between the channel region 203 and the gate electrode 211. The semiconductor device 200 furthermore includes a contact hole 204 being self-aligned to opposing sidewalls 205 of adjacent gate control structures 202 by intermediate spacers 206. An insulating layer 209 may be formed above each of the gate control structures 202, respectively.

Unlike the embodiment illustrated in FIG. 1, the channel region 203 of the semiconductor device 200 does not adjoin to a sidewall of the spacers 206. By way of example, the semiconductor device 200 may be a Metal Insulator Semiconductor Field-Effect Transistors (MISFET) such as a Metal Oxide Semiconductor Field Effect Transistor (MOSFET).

As regards the materials, the shape of device elements and further elements, for example, semiconductor regions formed in the SiC substrate 101, reference is taken to above explanations of the embodiment illustrated in FIG. 1.

Figure 3:
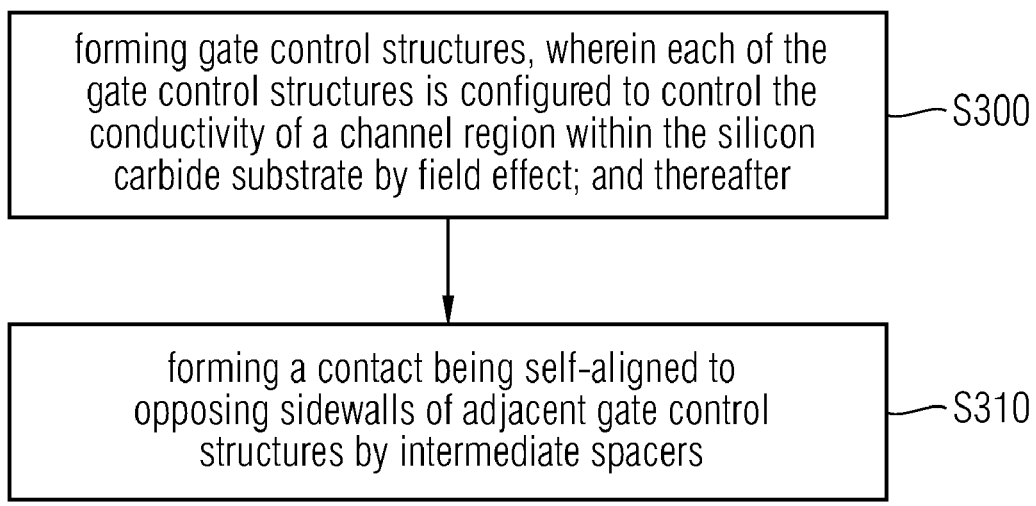
FIG. 3 is a simplified flowchart illustrating a method of manufacturing a SiC semiconductor device according to one embodiment.

FIG. 3 is a simplified flowchart of a method of manufacturing a semiconductor device in accordance with one embodiment. In S300, gate control structures are formed, wherein each of the gate control structures is configured to control the conductivity of a channel region within the SiC substrate by field effect. After carrying out, a contact is formed being self-aligned to opposing sidewalls of adjacent gate control structures by intermediate spacers. The semiconductor device may be a JFET, for example.

As activation of implanted dopants in a SiC substrate requires annealing at high temperatures of more than 1400° C., e.g., 1650° C.-1750° C., oxide structures previously formed over the SiC substrate would have been vaporized. Therefore, these oxide structures are removed prior to annealing. In other words, impurities, e.g., impurities forming source/drain regions, are implanted into the SiC substrate and subsequently annealed prior to formation of the spacers. Hence, after formation of the spacers, annealing is omitted.

The contact hole may be extended into the SiC substrate by forming a cavity within the SiC substrate. For example, the spacers may act as a mask during the etch of the SiC substrate so as to shift a bottom side of the contact hole into the SiC substrate.

The gate control structures may result from patterning a gate control layer via a hard mask. The spacers may result from forming a spacer layer over the hard mask and recessing the spacer layer until the spacers are left. Recessing of the spacer layer, for example, by etching, may result in spacers having an at least partly curved sidewall profile broadening the spacers with decreasing distance to a surface of the silicon carbide substrate. Remnant portions of the hard mask may remain on the gate control structures. A further remnant portion of the hard mask may remain in a peripheral area of an active cell area of the semiconductor device, for example.

Figure 4:
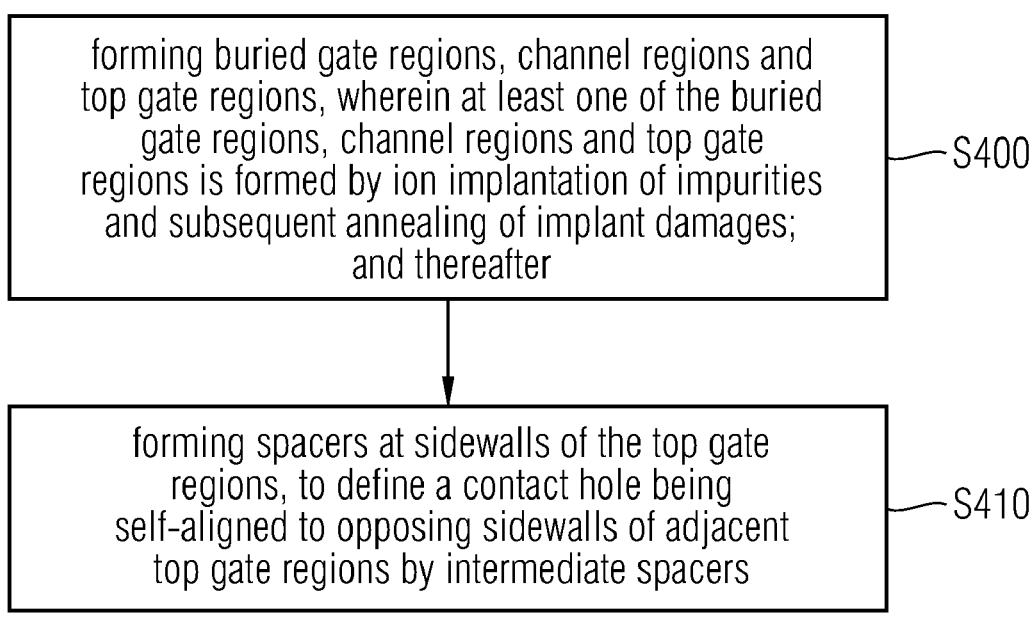
FIG. 4 is a simplified flowchart illustrating a method of manufacturing a SiC Junction Field Effect Transistor (JFET) according to one embodiment.

FIG. 4 is a simplified flowchart of a method of manufacturing a JFET in accordance with a further embodiment. In S400, buried gate regions, channel regions and top gate regions are formed, wherein at least one of the buried gate regions, channel regions and top gate regions is formed by ion implantation of impurities and subsequent annealing of implant damages. Thereafter, in S410, spacers are formed at sidewalls of the top gate regions defining a contact hole being self-aligned to opposing sidewalls of adjacent top gate regions by intermediate spacers.

The top gate regions and channel regions may be formed by patterning the SiC substrate, for example, an epitaxial SiC layer formed on a SiC base. By way of example, the top gate regions may be provided in protruding substrate portions. The channel regions may laterally adjoin to a sidewall of the spacers, respectively.

FIGS. 5A-5M refer to a method of manufacturing a JFET including contact holes self-aligned with regard to opposing sidewalls of adjacent top gate regions by intermediate spacers in accordance with one embodiment.

According to FIG. 5A illustrating a cross-section of a portion of a SiC substrate during manufacture of the JFET, impurities of a first conductivity type are implanted into a pre-processed SiC substrate 500 to define source regions 501. The pre-processed SiC substrate 500 may include a SiC base 502, for example, a SiC carrier such as a SiC wafer, and a SiC epitaxial layer 503 formed thereon. A first mask 504, for example, a hard mask formed of dielectric material such as $SiO_x$ by a precursor of tetra-ethyl-ortho-silane (TEOS) and a cap layer 505, for example, a polysilicon layer, may be formed on the pre-processed SiC substrate 500. The first mask 504, the cap layer 505 together with a second mask 506, for example, a patterned resin layer, may together constitute an implant mask defining the source regions 501. In one embodiment, impurities implanted as illustrated in FIG. 5A may also form drain regions within another part of the pre-processed SiC substrate 500 resulting in a lateral JFET. According to another embodiment, a drain region 501a may be formed on a side of the SiC substrate 500 opposite to the side where the source regions 501 are formed resulting in a vertical JFET (as illustrated in FIG. 5A. By way of example, the drain regions may be shifted to the source regions 501 in a direction perpendicular to the cross-sectional plane of FIG. 5A. The pre-processed SiC substrate 500 may include an active transistor cell region 507, a gate pad region 508 and a peripheral area 509. The second mask 506 may cover the cap layer 505 in the gate pad region 508 and the peripheral area 509 during the implant.

Referring to FIG. 5B, the second mask 506 may be removed. The first mask 504 may be undercut, for example, by laterally under etching the cap layer 505. Then the cap layer 505 may be removed and impurities of a second conductivity type different from the first conductivity type are implanted into the pre-processed SiC substrate 500 to form buried gate regions 510 in self-aligned manner with regard to the source regions 501. Self-alignment of the buried gate regions 510 with respect to the source regions 501 may be ascribed to the use of the first mask 504 as an implant mask both for the impurities of the source regions 501 and the impurities of the buried gate regions 510, wherein the undercut of the first mask 504 may define the lateral distance between the buried gate regions 510 and the source regions 501.

The first conductivity type may be an N-type and the second conductivity type may be a P-type. As a further example, the first conductivity type may be the P-type and the second conductivity type may be the N-type. The source regions 501 may be embedded in the buried gate regions 510. Impurities of the N-type may be N, P and impurities of the P-type may be Al, B, for example.

As illustrated in FIG. 5C, the first mask 504 may be removed and a second epitaxial SiC layer 511 of the first conductivity type may be formed on the first epitaxial SiC layer 503 of the first conductivity type. Impurities of the first conductivity type may be implanted into the second epitaxial SiC layer 511 to define a channel layer 512, for example, in a lower part of the second epitaxial SiC layer 511. The SiC substrate 500 then includes the SiC base 502, the first epitaxial SiC layer 503 and the second epitaxial SiC layer 511. All three elements may be of the first conductivity type.

In accordance with other embodiments, the implantation of the impurities of the first conductivity type defining the channel layer 512 may be omitted and the channel layer 512 may be defined by the impurity profile set during growth of the second epitaxial SiC layer 511.

As illustrated in FIG. 5D, portions of the second epitaxial SiC layer 511 may be partly removed, for example, by an etch process using a previously patterned third mask 513. The third mask 513 may cover the active cell region 507 and portions of the gate pad region 508 and the peripheral area 509. A protruding substrate portion 511a in the active cell region 507, part of the gate pad region 508 and the peripheral area 509 may result. By way of example, at least the channel layer 512 may be etched through or the second epitaxial SiC layer 511 may be etched through completely. In accordance with another embodiment, the etch stops below an upper edge of the first epitaxial SiC layer 503.

Figure 5E:
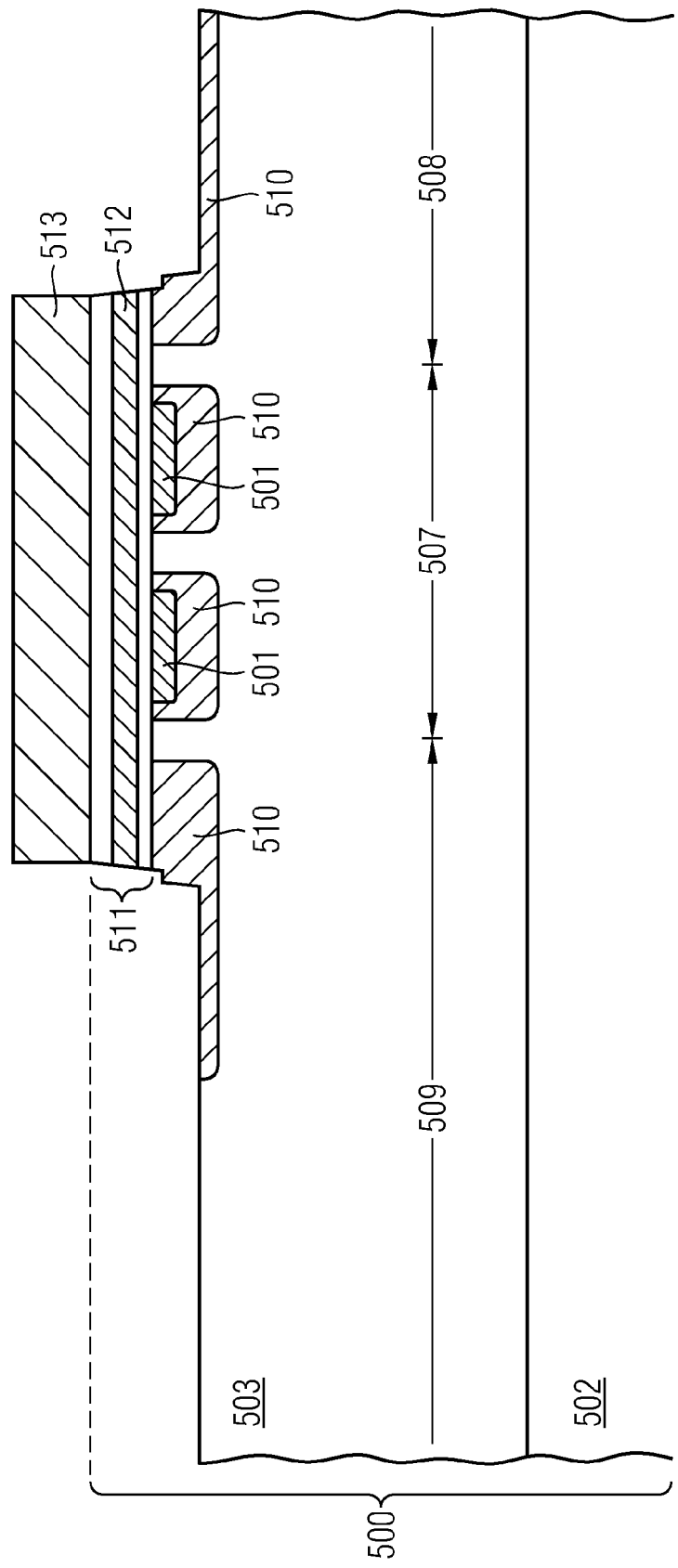
FIG. 5E illustrates a cross-sectional view of the SiC substrate portion of FIG. 5D after removing a part of the SiC substrate.

Referring to FIG. 5E, further portions of the SiC layer 500 may be removed in the gate pad region 508 and the peripheral area 509, for example, by an etch process. The removal of material of the SiC substrate 500 may be terminated before reaching a bottom side of the buried gate regions 510.

As illustrated in FIG. 5F, the third mask 513 may be removed and a fourth mask 514 may be formed covering part of the peripheral area 509. Impurities of the first conductivity type are implanted into the SiC substrate 500 in the active cell region 507, the gad pad region 508 and part of the peripheral area 509 to define a top gate layer 515 of the second conductivity type in the second epitaxial SiC layer 511 above the channel layer 512. The top gate layer 515 may extend into the SiC substrate 500 in the peripheral area 509 and the gate pad region 508, respectively.

Referring to FIG. 5G, the fourth mask 514 may be removed and a fifth mask 516 covering the gate pad region 508, the active cell region 507 and part of the peripheral area 509 may be formed. Impurities of the second conductivity type may be implanted into part of the peripheral area 509 of the SiC substrate 500 to define a peripheral semiconductor zone 517 that overlaps with portions of the buried gate regions 510.

Thereafter, the fifth mask 516 is removed to uncover a surface of the SiC substrate 500 completely and no oxide structures remain thereon at that point of time. After forming an optional cap layer, for example, a graphite layer, implanted dopants within the SiC substrate 500 are activated by annealing at temperatures in a range of 1500° C.-1900° C., e.g., 1650° C.-1750° C. The implant damages originate from the implantation of impurities into the SiC substrate 500 in course of formation of the source regions 501, the buried gate regions 510, the channel layer 512, the top gate layer 515 and the peripheral semiconductor zone 517, for example. After annealing the SiC substrate 500, the optional cap layer is removed.

Figure 5H:
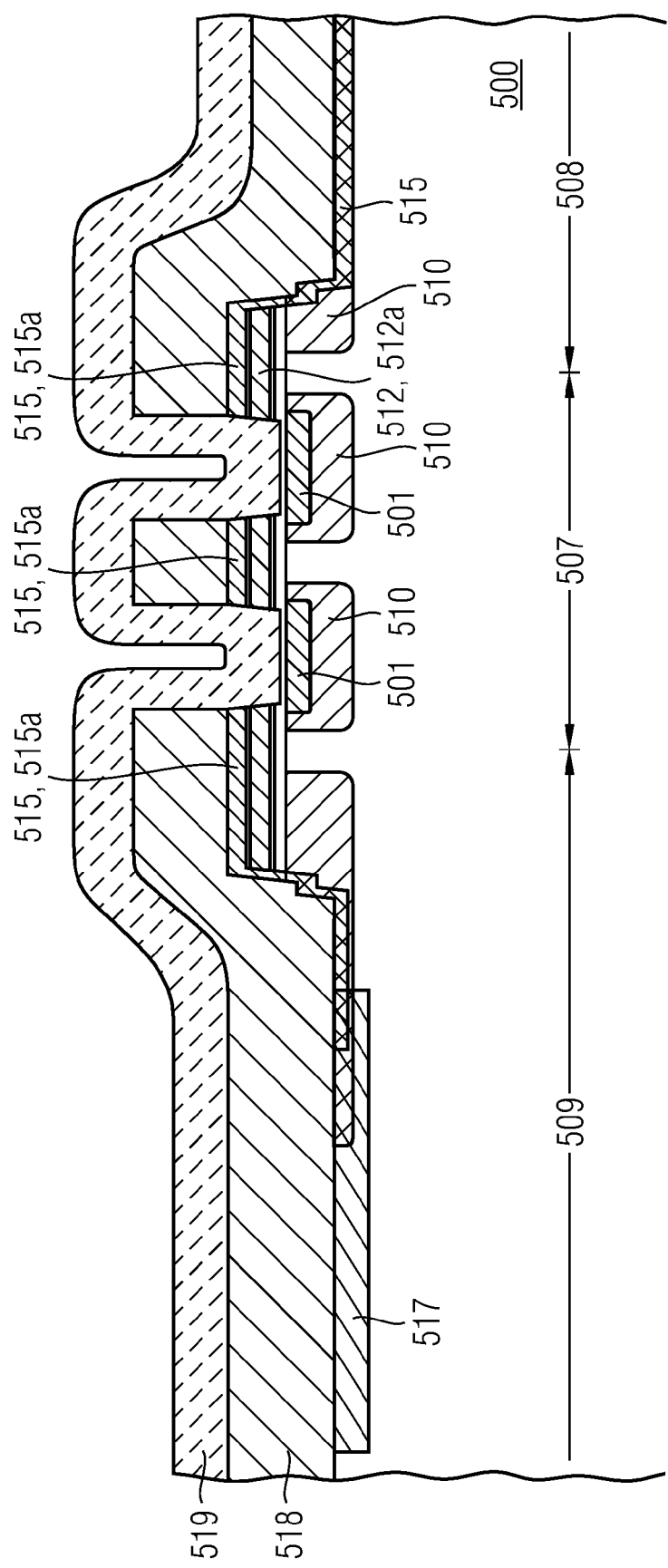
FIG. 5H illustrates a cross-sectional view of the SiC substrate portion of FIG. 5G after forming a sixth mask, patterning the top gate layer and the channel layer of the SiC substrate into top gate regions and channel regions defined by the sixth mask, and forming a spacer layer on the sixth mask and exposed substrate portions.

Referring to FIG. 5H, a sixth mask layer is formed on the SiC substrate 500 and patterned to a sixth mask 518, for example, a dielectric hard mask such as an oxide hard mask, e.g., $SiO_2$, having openings formed above the source regions 501. The hard mask 518 acts as an etch mask during patterning of a portion of the SiC substrate 500, i.e. patterning the channel layer 512 and the top gate layer 515 to define channel regions 512a and top gate regions 515a. The recess of material of the SiC substrate 500 may be terminated before the source regions 501 are exposed, for example. Thereafter a spacer layer 519, for example, a spacer oxide layer such as SiO₂ or a spacer nitride layer such as Si₃N₄, is formed on the sixth mask 518 and exposed portions of the SiC substrate 500.

Referring to FIG. 5I, the spacer layer 519 is recessed, for example, by an anisotropic etch process, until spacers 520 remain. The spacers 520 laterally adjoin to channel regions 512a, top gate regions 515a and the sixth mask 518. Contact holes 521 are self-aligned to opposing sidewalls of adjacent top gate regions 515a by intermediate spacers 520. The contact holes 521 may be extended into the SiC substrate 500 by etching into the source regions 501 or into the buried gate regions 510, for example. Thus, the contact holes 521 may not only contact the source regions 501, but also the buried gate regions 510 of the JFET.

As illustrated in FIG. 5J, the sixth mask 518 may be partly removed, for example, by lithography, leaving remnant portions 522 on top gate regions 515a in the active cell region 508 and on the SiC substrate 500 in the peripheral area 509. Thereafter, a contact layer 523, for example, a liner comprising NiAl, may be formed on the remnant portions 522, the spacers 520 and exposed portions of the SiC substrate 500.

As illustrated in FIG. 5K, after patterning the contact layer 523, for example, by lithography and wet etching, the contact layer 523 partly remains within the contact holes 521 and on exposed portions of the SiC substrate 500. Thereafter, an intermediate dielectric layer 524, for example, an oxide layer such as SiO₂, is formed on the remnant portions 522, the spacers 520 and exposed portions of the SiC substrate 500 and patterned so as to open the contact holes 521 and to expose part of the SiC substrate 500 in the gate pad region 508.

Figure 5L:
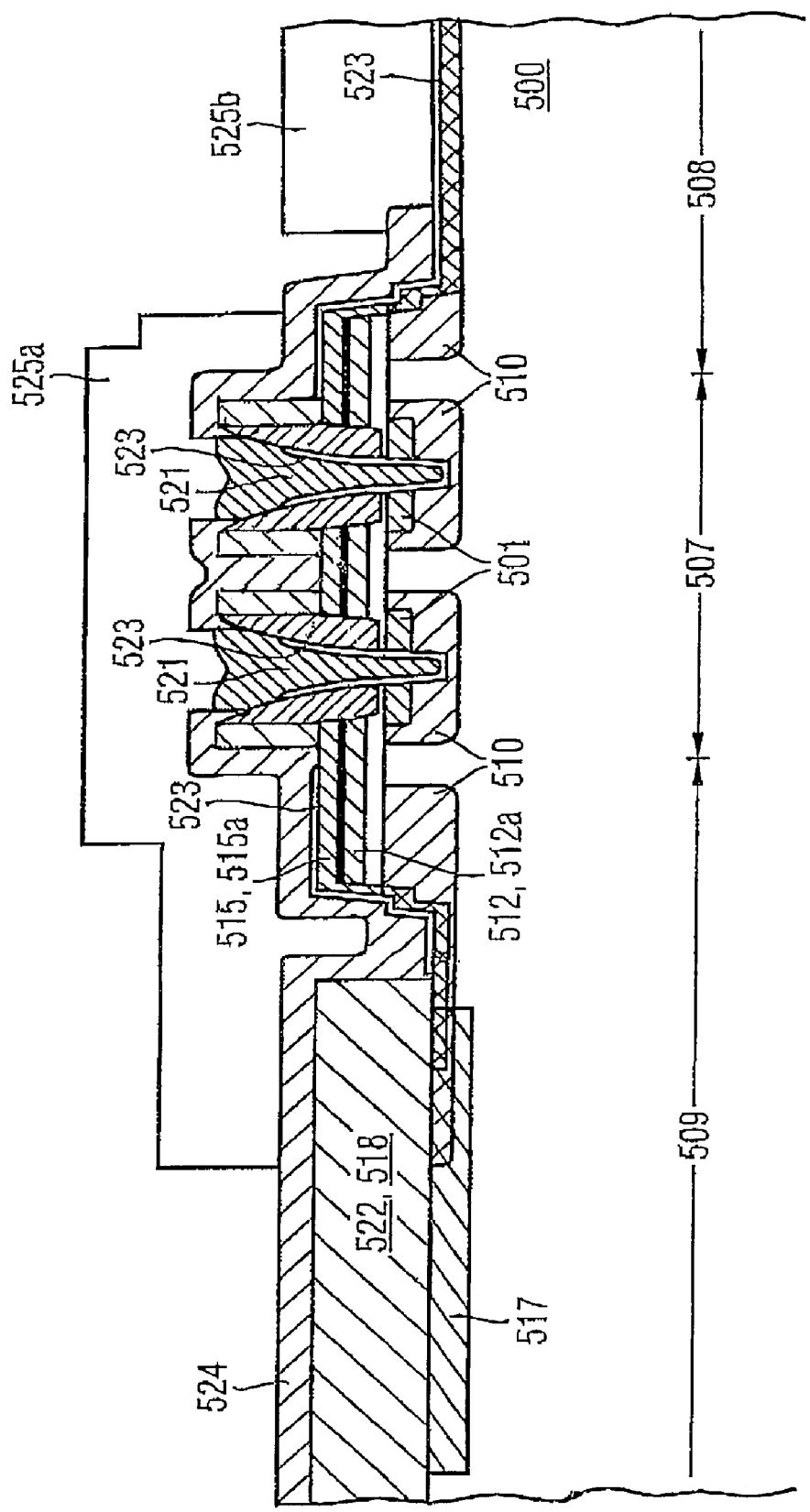
FIG. 5L illustrates a cross-sectional view of the SiC substrate portion of FIG. 5K after filling the contact holes with a conductive material and forming a conductive layer above and in contact with the conductive material in the contact holes.

Referring to FIG. 5L, the contact holes 521 are filled with one or a plurality of conductive material(s), for example, Ti/Al, C or Cu, and contact regions 525a, 525b are formed. The contact region 525a may provide an electrical contact to the source regions 501 and the buried gate regions 510 via the conductive materials filled in the contact holes 521, and the contact region 525b may provide electrical low resistive contact to the buried gate region 510 in the gate pad region 508. By way of example, contact regions 525a, 525b may be formed of the same conductive layer, for example, a Cu layer or a layer stack of conductive layers, by lithographically patterning the layer or the layer stack. When forming the contact regions 525a, 525b, a further contact region 525c may be formed in another part of the SiC substrate 500 to provide electrical contact to drain regions.

Figure 5M:
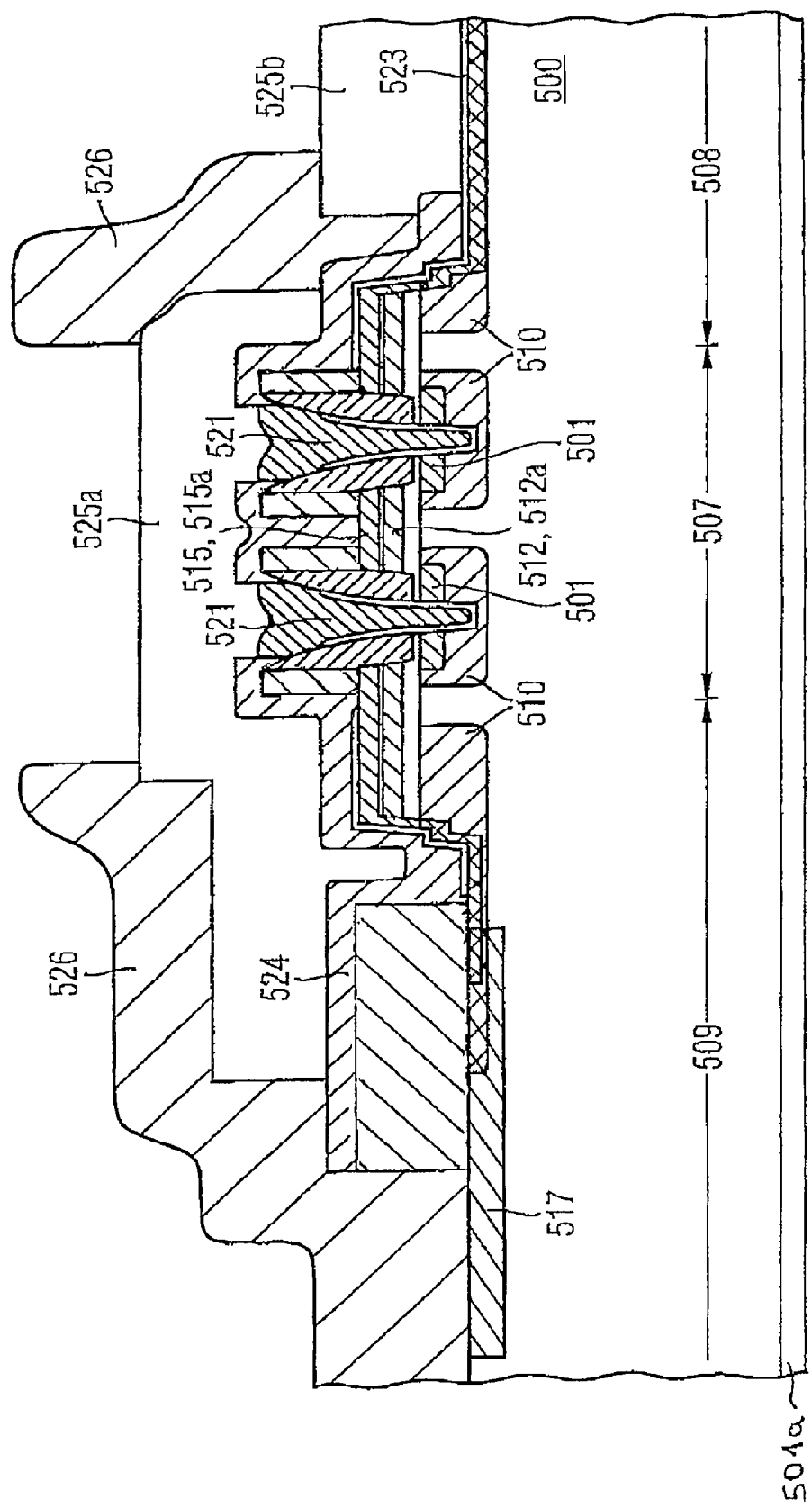
FIG. 5M illustrates a cross-sectional view of the SiC substrate portion of FIG. 5L after patterning the top metal layer used for contacting the device and forming a protection layer.

As illustrated in FIG. 5M, part of the remnant portions 522 in the peripheral area 509 may be removed and a protection layer 526, for example, a passivation layer such as an imide layer may be formed above the SiC substrate 500 and patterned so as to provide openings to the contact regions 525a in the active cell region 507 and to the contact region 525b in the gate pad region 508. Further processes, for example, thermal anneals, may follow to complete the JFET.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A Junction Field Effect Transistor, comprising:
    gate control structures each configured to control the conductivity of a channel region within a silicon carbide substrate by field effect; and
    a contact being self-aligned to opposing sidewalls of adjacent gate control structures by intermediate spacers,
    wherein the contact is connected to a bottom gate region of the Junction Field Effect Transistor and the gate control structures include top gate control structures, the channel region being sandwiched between one of the top gate structures and the bottom gate region, and
    wherein a source region is embedded in the bottom gate region.

2. The Junction Field Effect Transistor of claim 1, wherein the contact has a same lateral distance to both adjacent gate control structures, respectively.

3. The Junction Field Effect Transistor of claim 1, wherein the bottom gate region is self-aligned to the source region.

4. A method for manufacturing the Junction Field Effect Transistor of claim 1, the method comprising:
    forming the gate control structures, wherein each of the gate control structures is configured to control the conductivity of the channel region within the silicon carbide substrate by field effect;
    forming the contact being self-aligned to opposing sidewalls of adjacent gate control structures by intermediate spacers;
    wherein the gate control structures result from patterning a gate control structure layer via a hard mask; and
    the spacers result from forming a spacer layer over the hard mask and removing the spacer layer until the spacers are left,
    wherein the hard mask is patterned so as to leave a remnant portion of the hard mask at least over the gate control structures and an additional remnant portion of the hard mask in a peripheral area of an active cell region.

5. The method of claim 4, further comprising:
    forming semiconductor regions within the silicon carbide substrate by ion implantation of impurities and annealing implant damages prior to formation of the gate control structures.

6. The method of claim 4, further comprising:
    extending the contact into the silicon carbide substrate by forming a cavity within the silicon carbide substrate.

7. The method of claim 4, comprising forming the spacers by etching the spacer layer resulting in an at least partly curved spacer sidewall profile broadening the spacers with decreasing distance to a surface of the silicon carbide substrate.

8. The method of claim 6, comprising carrying out annealing of the implant damages with the blank SiC substrate having no oxide layers formed thereon.

9. A method of manufacturing the Junction Field Effect Transistor of claim 1 within the silicon carbide substrate, the method comprising:
    forming the gate control structures, wherein each of the gate control structures is configured to control the conductivity of the channel region within the silicon carbide substrate by field effect;
    wherein forming the gate control structure includes forming buried gate regions, channel regions and top gate regions, wherein at least one of the buried gate regions, the channel regions and the top gate regions is formed by ion implantation of impurities and subsequent annealing of implant damages; and thereafter
    forming intermediate spacers extending along sidewalls of the gate control structures and the contact being self-aligned to opposing sidewalls of adjacent gate control structures by the intermediate spacers.

10. The method of claim 9, further comprising carrying out the annealing of the implant damages with the blank SiC substrate having no oxide layers formed thereon.

11. The method of claim 9, further comprising forming the buried gate regions in self-aligned manner with regard to previously formed source regions.

12. The method of claim 9, wherein the gate control structures result from patterning a gate control structure layer via a hard mask; and the spacers result from forming a spacer layer over the hard mask and removing the spacer layer until the spacers are left.

13. The method of claim 12, further comprising forming the spacers by etching the spacer layer resulting in an at least partly curved spacer sidewall profile broadening the spacers with decreasing distance to a surface of the silicon carbide substrate.

14. The method of claim 9, further comprising:

patterning the hard mask so as to leave a remnant portion of the hard mask at least over the gate control structures.

* * * * *